US011462533B2

(12) United States Patent
Liu et al.

(10) Patent No.: US 11,462,533 B2
(45) Date of Patent: Oct. 4, 2022

(54) ELECTROSTATIC DISCHARGE PROTECTION CIRCUIT, ARRAY SUBSTRATE AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Chen Ting Liu, Beijing (CN); Zhiming Hu, Beijing (CN); Chunxiang Nan, Beijing (CN); Xiaodong Pan, Beijing (CN); Lili Cao, Beijing (CN); Ping Wang, Beijing (CN); Xiaochuan Ma, Beijing (CN)

(73) Assignees: ORDOS YUANSHENG OPTOELECTRONICS CO., LTD., Inner Mongolia (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 499 days.

(21) Appl. No.: 16/606,929

(22) PCT Filed: Feb. 28, 2019

(86) PCT No.: PCT/CN2019/076496
§ 371 (c)(1),
(2) Date: Oct. 21, 2019

(87) PCT Pub. No.: WO2019/227992
PCT Pub. Date: Dec. 5, 2019

(65) Prior Publication Data
US 2021/0366899 A1 Nov. 25, 2021

(30) Foreign Application Priority Data
Jun. 1, 2018 (CN) .......................... 201810558243.5

(51) Int. Cl.
H01L 27/02 (2006.01)
H01L 27/32 (2006.01)
(Continued)

(52) U.S. Cl.
CPC ...... *H01L 27/0296* (2013.01); *H01L 27/0288* (2013.01); *H01L 27/0292* (2013.01);
(Continued)

(58) Field of Classification Search
CPC ............... H01L 27/3276; H01L 27/124; H01L 27/0296; H01L 27/0292; H01L 27/0288
See application file for complete search history.

(56) References Cited

U.S. PATENT DOCUMENTS 11,171,195 B2 * 11/2021 Kim ...................... H01L 27/124
2007/0222069 A1 9/2007 Furuta
(Continued)

FOREIGN PATENT DOCUMENTS

| CN | 101038913 | 9/2007 |
| CN | 101271893 | 9/2008 |
| CN | 108717939 | 10/2018 |

*Primary Examiner* — Brigitte A Paterson
(74) *Attorney, Agent, or Firm* — Leason Ellis LLP

(57) ABSTRACT

An ESD protection circuit, an array substrate and a display device are disclosed. The ESD protection circuit includes a plurality of first ESD units, each of which includes: a first active layer, a first insulating layer, a first metallic layer, a second insulating layer and a second metallic layer which are disposed on a base substrate; the first active layer includes a plurality of first connection terminals; the first metallic layer includes a plurality of first conductive terminals; the second metallic layer includes a plurality of second conductive terminals an orthographic projection of the first metallic layer and an orthographic projection of the second metallic layer the base substrate are at least partly overlapped with an orthographic projection of the first active layer on the base substrate respectively; and the first con- (Continued)

ductive terminals and the second conductive terminals are electrically connected with different first connection terminals, respectively.

20 Claims, 9 Drawing Sheets

(51) Int. Cl.
*H01L 27/12* (2006.01)
*H02H 9/04* (2006.01)

(52) U.S. Cl.
CPC ........... *H01L 27/124* (2013.01); *H02H 9/046* (2013.01); *H01L 27/3276* (2013.01)

(56) References Cited

U.S. PATENT DOCUMENTS

| | | | |
|---|---|---|---|
| 2008/0230820 A1 | 9/2008 | Maeda et al. | |
| 2013/0341651 A1* | 12/2013 | Kim | G06F 3/0443 257/432 |
| 2015/0270287 A1* | 9/2015 | Kim | H01L 27/124 257/40 |
| 2018/0329263 A1* | 11/2018 | Hao | G02F 1/1368 |
| 2019/0229177 A1* | 7/2019 | Kim | G09G 3/3233 |

\* cited by examiner

ELECTROSTATIC DISCHARGE PROTECTION CIRCUIT, ARRAY SUBSTRATE AND DISPLAY DEVICE

CROSS-REFERENCE TO RELATED PATENT APPLICATIONS

This application is a U.S. National Stage Application under 35 U.S.C. § 371 of International Patent Application No. PCT/CN2019/076496, filed Feb. 28, 2019, which claims priority of the Chinese Patent Application No. 201810558243.5, filed on Jun. 1, 2018, both of which are incorporated by reference in their entireties as part of the present application.

TECHNICAL FIELD

Embodiments of the present disclosure relate to an electrostatic discharge protection circuit, an array substrate, and a display device.

BACKGROUND

With the continuous development of technologies, more and more electronic products have been popularized in people's lives. Moreover, electronic products incorporated with display devices such as televisions, computers, mobile phones, laptops and intelligent watches have become indispensable products in people's lives because of their excellent interactive characteristics.

An electrostatic discharge (ESD) protection circuit is one of the important components of a display device (e.g., a liquid crystal display device and an organic light-emitting diode display device) in order to protect the display devices against damages resulted by electrostatic discharge during manufacture, transportation and operation.

SUMMARY

At least one embodiment of the present disclosure provides an electrostatic discharge (ESD) protection circuit, including: a base substrate; and a plurality of first ESD units on the base substrate. Each of the plurality of first ESD units includes: a first active layer disposed on the base substrate; a first insulating layer disposed at a side of the first active layer away from the base substrate; a first metallic layer disposed at a side of the first insulating layer away from the base substrate; a second insulating layer disposed at a side of the first metallic layer away from the base substrate; and a second metallic layer disposed at a side of the second insulating layer away from the base substrate. The first active layer includes a plurality of first connection terminals; the first metallic layer includes a plurality of first conductive terminals; the second metallic layer includes a plurality of second conductive terminals; an orthographic projection of the first metallic layer on the base substrate and an orthographic projection of the second metallic layer on the base substrate are at least partly overlapped with an orthographic projection of the first active layer on the base substrate, respectively; and the plurality of first conductive terminals and the plurality of second conductive terminals are electrically connected with different ones of the plurality of first connection terminals, respectively.

For example, in the ESD protection circuit provided by an embodiment of the present disclosure, the first metallic layer includes a plurality of first strip portions, the second metallic layer includes a plurality of second strip portions, and orthographic projections of the plurality of first strip portions on the base substrate are arranged alternately with orthographic projections of the plurality of second strip portions on the base substrate.

For example, in the ESD protection circuit provided by an embodiment of the present disclosure, the first conductive terminals and the second conductive terminals are configured to be electrically connected with ESD ports, respectively; and static electricity at the ESD ports connected with the first conductive terminals has an electrical property opposite to that of static electricity at the ESD ports connected with the second conductive terminals.

For example, in the ESD protection circuit provided by an embodiment of the present disclosure, each of the plurality of first ESD units further includes: a via hole disposed in the first insulating layer and in the second insulating layer, and exposing the first active layer; and a conductive connection layer disposed in the via hole to electrically connect the plurality of first conductive terminals and the plurality of second conductive terminals with different ones of the plurality of first connection terminals, respectively. The conductive connection layer includes a source-drain electrode layer.

For example, in the ESD protection circuit provided by an embodiment of the present disclosure, an angle is formed between an extension direction of the first conductive terminal and an extension direction of the second conductive terminal, and the angle is in a range of 30-90 degrees.

For example, in the ESD protection circuit provided by an embodiment of the present disclosure, the plurality of first ESD units are arranged along a closed line trace.

For example, in the ESD protection circuit provided by an embodiment of the present disclosure, in each of the plurality of first ESD units, an extension direction of the first conductive terminal and an extension direction of the second conductive terminal are perpendicular to two edges of a vertex angle of a first polygon ring, respectively; the first ESD unit is located at the vertex angle.

For example, the ESD protection circuit provided by an embodiment of the present disclosure further includes a plurality of second ESD units disposed on the base substrate. Each of the plurality of second ESD units includes: a second active layer disposed on the base substrate; a third insulating layer disposed at a side of the second active layer away from the base substrate; a third metallic layer disposed at a side of the third insulating layer away from the base substrate; a fourth insulating layer disposed at a side of the third metallic layer away from the base substrate; and a fourth metallic layer disposed at a side of the fourth insulating layer away from the base substrate. The second active layer includes a plurality of second connection terminals located at an edge of the second active layer; the third metallic layer includes a plurality of third conductive terminals located at an edge of the third metallic layer, or, the fourth metallic layer includes a plurality of fourth conductive terminals located at an edge of the fourth metallic layer; an orthographic projection of the third metallic layer on the base substrate and an orthographic projection of the fourth metallic layer on the base substrate are at least partly overlapped with an orthographic projection of the second active layer on the base substrate, respectively; and the plurality of third conductive terminals or the plurality of fourth conductive terminals are electrically connected with the plurality of second connection terminals, respectively.

For example, in the ESD protection circuit provided by an embodiment of the present disclosure, the first active layer and the second active layer are two portions of a same active layer pattern; the first insulating layer and the third insulating layer are two portions of a same insulating layer pattern; the first metallic layer and the third metallic layer are two portions of a same metallic layer; the second insulating layer and the fourth insulating layer are two portions of a same insulating layer pattern; and the second metallic layer and the fourth metallic layer are two portions of a same metallic layer pattern.

For example, in the ESD protection circuit provided by an embodiment of the present disclosure, the plurality of first ESD units and the plurality of second ESD units are arranged along a closed line trace.

For example, in the ESD protection circuit provided by an embodiment of the present disclosure, in the first ESD unit and the second ESD unit that are adjacent to each other, the first metallic layer of the first ESD unit and the third metallic layer of the second ESD unit respectively include a first tip portion and a third tip portion which are alternately arranged, the first tip portion and the third tip portion are insulated from each other to form a third ESD unit.

For example, in the ESD protection circuit provided by an embodiment of the present disclosure, in the first ESD unit and the second ESD unit that are adjacent to each other, the second metallic layer of the first ESD unit and the fourth metallic layer of the second ESD unit respectively include a second tip portion and a fourth tip portion which are alternately arranged, the second tip portion and the fourth tip portion are insulated from each other to form a fourth ESD unit.

For example, in the ESD protection circuit provided by an embodiment of the present disclosure, a distance between the third ESD unit and the fourth ESD unit is greater than 2 times of a distance between the first tip portion and the third tip portion.

For example, the ESD protection circuit provided by an embodiment of the present disclosure further includes a central ESD structure located at a center of a second polygon ring. The central ESD unit includes: a fifth metallic layer disposed in a same layer with the first metallic layer; and a sixth metallic layer disposed in a same layer with the second metallic layer. In the first ESD unit and the central ESD structure that are adjacent to each other, the first metallic layer of the first ESD unit and the fifth metallic layer of the central ESD structure respectively include a fifth tip portion and a sixth tip portion which are alternately arranged, the fifth tip portion and the sixth tip portion are insulated from each other to form a sixth ESD unit.

For example, in the ESD protection circuit provided by an embodiment of the present disclosure, in the second ESD unit and the central ESD structure that are adjacent to each other, the third metallic layer of the second ESD unit and the fifth metallic layer of the central ESD structure respectively include a seventh tip portion and an eighth tip portion which are alternately arranged, the seventh tip portion and the eighth tip portion are insulated from each other to form a sixth ESD unit.

For example, in the ESD protection circuit provided by an embodiment of the present disclosure, in the first ESD unit and the central ESD structure that are adjacent to each other, the second metallic layer of the first ESD unit and the sixth metallic layer of the central ESD structure respectively include a ninth tip portion and a tenth tip portion which are alternately arranged, the ninth tip portion and the tenth tip portion are insulated from each other to form a seventh ESD unit.

For example, in the ESD protection circuit provided by an embodiment of the present disclosure, in the second ESD unit and the central ESD structure that are adjacent to each other, the fourth metallic layer of the second ESD unit and the sixth metallic layer of the central ESD structure respectively include an eleventh tip portion and a twelfth tip portion which are alternately arranged, the eleventh tip portion and the twelfth tip portion are insulated from each other to form an eighth ESD unit.

For example, in the ESD protection circuit provided by an embodiment of the present disclosure, the central ESD structure further includes: a central conductive structure electrically connected with the first active layer, the fifth metallic layer and the sixth metallic layer, respectively.

At least one embodiment of the present disclosure provides an array substrate, including the ESD protection circuit described in any of the embodiments above.

For example, the array substrate provided by an embodiment of the present disclosure further includes: an organic light-emitting layer; and a thin film transistor (TFT) unit. The first active layer and an active layer of the TFT unit are located in a same layer; the first metallic layer and a first gate electrode of the TFT unit are located in a same layer; and the second metallic layer and a second gate electrode of the TFT unit are located in a same layer.

At least one embodiment of the present disclosure provides a display device, including the array substrate described in any of the embodiments above.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
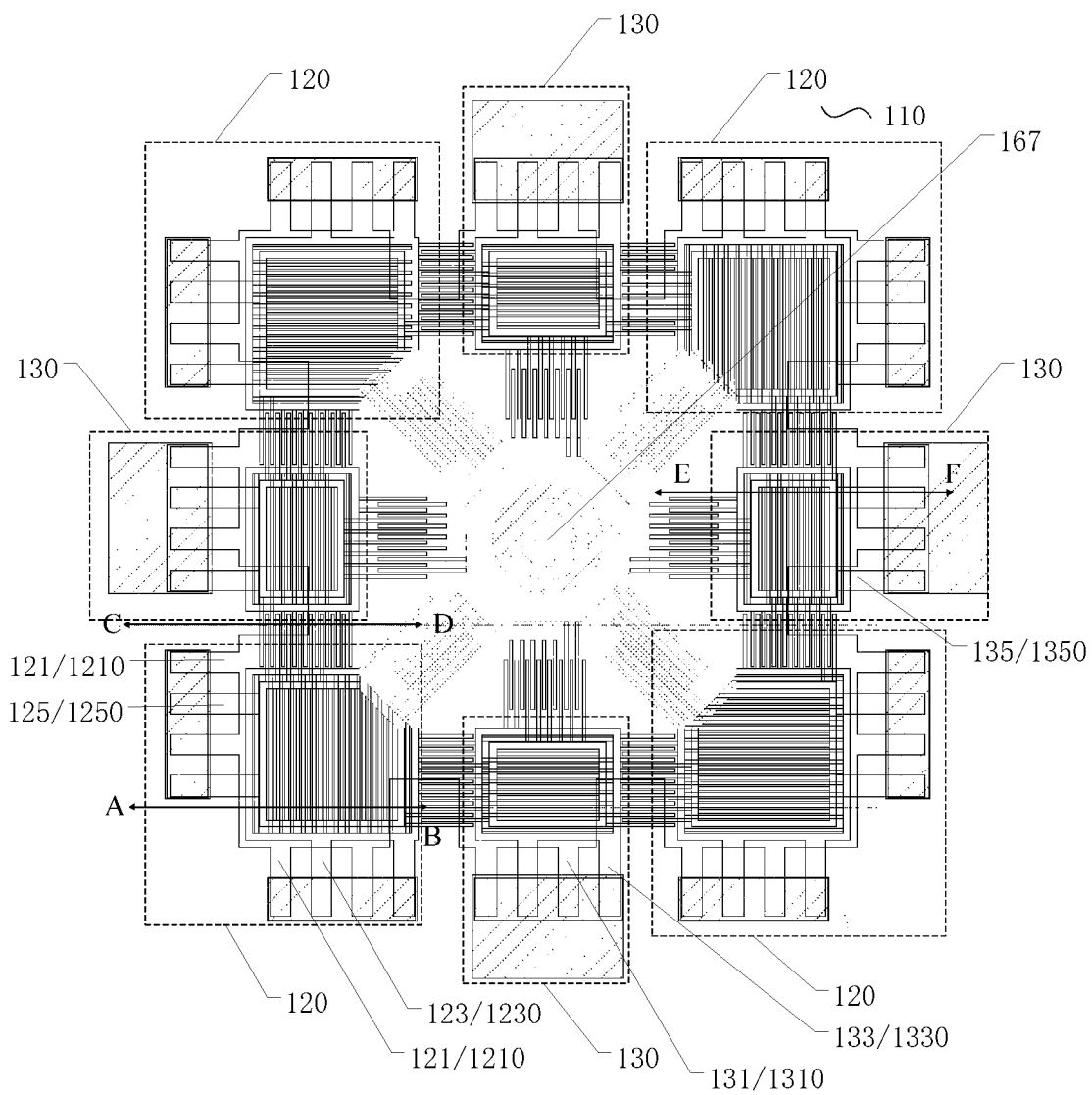
FIG. 1 is a plan view of an ESD protection circuit provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first", "second", etc., which are used in the description and the claims of the present application for disclosure, are not intended to indicate any sequence, amount or importance, but distinguish various components. The terms "comprise," "comprising", "include", "including", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

At present, conventional electrostatic discharge (ESD) protection circuits are classified into the following three types: an ESD protection circuit which connects a gate electrode with a drain electrode of a thin film transistor (TFT) in a shorted manner or connects a source electrode with the gate electrode of the TFT in a shorted manner; an ESD protection pattern formed by an Indium Tin Oxide (ITO) electrode; and an ESD protection pattern formed by a semi-conductive layer. However, the ESD protection circuit obtained by connecting the gate electrode with the drain electrode of the TFT in a shorted manner or connecting the source electrode with the gate electrode of the TFT in a shorted manner only possesses "one-way through" property, and can be utilized for discharging and neutralizing transient high current of one-way ESD; the ESD protection pattern formed by ITO electrode possesses passive property and "two-way through" property, but lacks the capability of discharging and neutralizing transient high current of one-way ESD; the ESD protection pattern formed by semi-conductive layer possesses passive property and "two-way through" property, but lacks the capability of discharging and neutralizing transient high current of one-way ESD. As it can be seen, the above-described types of ESD protection circuits have restriction in ESD protection effects, and cannot effectively and quickly perform electrostatic discharge and neutralization involved with multiple layers and certain specifications.

On the other hand, an array substrate of an existing organic light-emitting diode (OLED) display device or low temperature poly-silicon liquid crystal display (LTPS-LCD) device has complicated manufacturing process, and the array substrate is provided with a plurality of insulating layers and a plurality of conductive layers (e.g., metallic layers). As a result, an accumulation of static electricity is easily occurred during a manufacturing process of the above-mentioned array substrate, and the array substrate is liable to be damaged due to electrostatic discharge if the static electricity in respective layers cannot be effectively discharged or neutralized.

Therefore, embodiments of the present disclosure provide an electrostatic discharge (ESD) protection circuit, an array substrate and a display device. The ESD protection circuit includes: a base substrate; and a plurality of first ESD units disposed on the base substrate. Each of the plurality of first ESD units includes: a first active layer disposed on the base substrate; a first insulating layer disposed at a side of the first active layer away from the base substrate; a first metallic layer disposed at a side of the first insulating layer away from the base substrate; a second insulating layer disposed at a side of the first metallic layer away from the base substrate; and a second metallic layer disposed at a side of the second insulating layer away from the base substrate. The first active layer includes a plurality of first connection terminals located at an edge of the first active layer; the first metallic layer includes a plurality of first conductive terminals located at an edge of the first metallic layer; the second metallic layer includes a plurality of second conductive terminals located at an edge of the second metallic layer; an orthographic projection of the first metallic layer on the base substrate and an orthographic projection of the second metallic layer on the base substrate are at least partly overlapped with an orthographic projection of the first active layer on the base substrate, respectively; and the plurality of first conductive terminals and the plurality of second conductive terminals are electrically connected with different ones of the plurality of first connection terminals, respectively. As a result, the ESD protection circuit can provide a new type of ESD protection circuit which can be used for ESD protection in multi-layered structures. Furthermore, the ESD protection circuit has multiple input ports to achieve quick discharge and neutralization of static electricity, and also possesses advantages including the capability of actively and passively performing electrostatic discharge, the equally two-way through property, and the adaptability for electrostatic discharge of various specifications (voltages).

Hereinafter, the ESD protection circuit, the array substrate and the display device provided by embodiments of the present disclosure will be described in conjunction with the accompanying drawings.

Figure 2A:
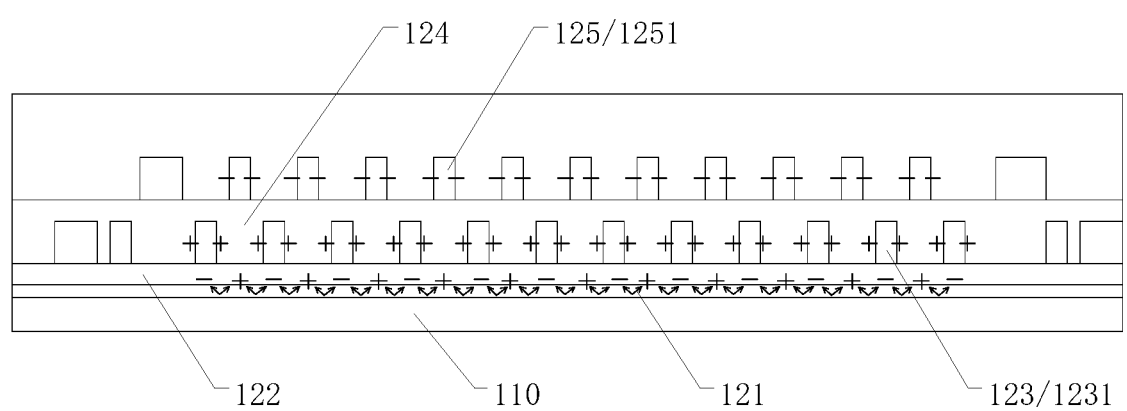
FIG. 2A is a cross-sectional view of an ESD protection circuit provided by an embodiment of the present disclosure taken along AB direction of FIG. 1.
Figure 2B:
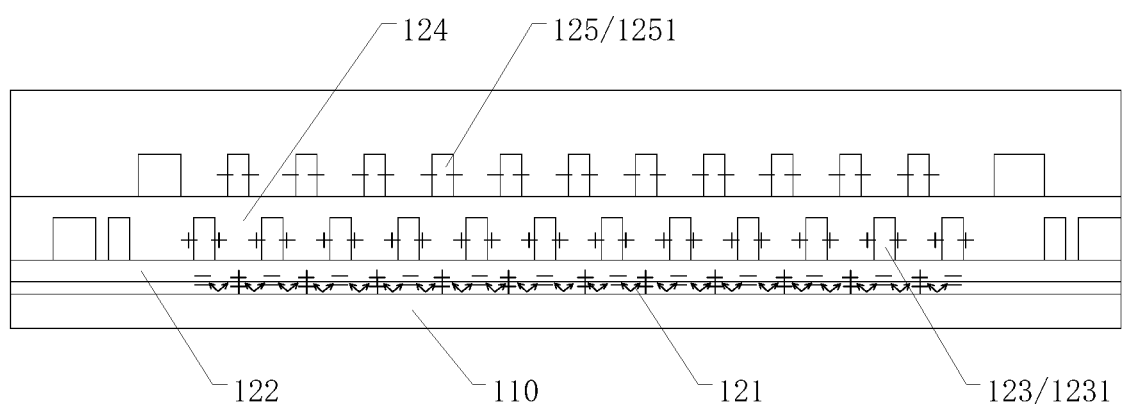
FIG. 2B is a cross-sectional view of an ESD protection circuit provided by an embodiment of the present disclosure taken along AB direction of FIG. 1.

At least one embodiment of the present disclosure provides an ESD protection circuit. FIG. 1 is a plan view of an ESD protection circuit provided by an embodiment of the present disclosure; FIG. 2A is a cross-sectional view of an ESD protection circuit provided by an embodiment of the present disclosure taken along AB direction of FIG. 1; and FIG. 2B is a cross-sectional view of an ESD protection circuit provided by an embodiment of the present disclosure taken along AB direction of FIG. 1. As illustrated in FIG. 1, FIG. 2A and FIG. 2B, the ESD protection circuit includes: a base substrate 110; and a plurality of first ESD units 120 disposed on the base substrate 110. Each of the plurality of first ESD units 120 includes: a first active layer 121 disposed on the base substrate 110; a first insulating layer 122 disposed at a side of the first active layer 121 away from the base substrate 110; a first metallic layer 123 disposed at a side of the first insulating layer 122 away from the base substrate 110; a second insulating layer 124 disposed at a side of the first metallic layer 123 away from the base substrate 110; and a second metallic layer 125 disposed at a side of the second insulating layer 124 away from the base substrate 110. The first active layer 121 includes a plurality of first connection terminals 1210 located at an edge of the first active layer 121; the first metallic layer 123 includes a plurality of first conductive terminals 1230 located at an edge of the first metallic layer 123; the second metallic layer 125 includes a plurality of second conductive terminals 1250 located at an edge of the second metallic layer 125; an orthographic projection of the first metallic layer 123 on the base substrate 110 and an orthographic projection of the second metallic layer 125 on the base substrate 110 are at least partly overlapped with an orthographic projection of the first active layer 121 on the base substrate 110, respectively; and the first conductive terminals 1230 and the second conductive terminals 1250 are electrically connected with different ones of the plurality of first connection terminals 1210, respectively.

In the ESD protection circuit provided by the present embodiment, the first conductive terminal 1230 can be connected with one ESD port (e.g., one conductive structure of a multi-layered structures), and the second conductive terminal 1250 can be connected with another ESD port (e.g., another conductive structure of the multi-layered structures), so as to guide the static electricity on the two ESD ports to the first ESD unit 120 for discharge and neutralization of the static electricity. Moreover, because the ESD protection circuit includes a plurality of first ESD units 120, it can provide a plurality of conductive structures with electrostatic protection at the same time. It should be explained that, the above-mentioned ESD port includes a film layer or a lead wire which require for ESD protection.

For example, the static electricity at the ESD port connected with the first conductive terminal 1230 has an electric property which is opposite to that of the static electricity at the ESD port connected with the second conductive terminal 1250. It should be explained that, because the static electricity generated from conductive structures that are insulated from each other and adjacent to each other during the manufacturing process usually is heterologous, that is, the static electricity generated on one conductive structure is positive static electricity while the static electricity generated on the other conductive structure is negative static electricity, the above-mentioned first ESD unit can neutralize the above-mentioned positive static electricity and negative static electricity on the first active layer.

For example, upon the ESD (static electricity) being at a low level (e.g., the ESD is smaller than 50V), assuming that the first conductive terminal 1230 carries positive static electricity and the second conductive terminal 1250 carries negative static electricity, because the first conductive terminal 1230 and the second conductive terminal 1250 both are connected to the first active layer 121, the first active layer 121 would be slightly conductive at this time, so as to discharge and neutralize the static electricity on the first conductive terminal 1230 and the second conductive terminal 1250.

For example, upon the ESD (static electricity) being at a middle level (e.g., the ESD is greater than 50V and smaller than 300V), as illustrated in FIG. 1 and FIG. 2A, the first conductive terminal 1230 carries positive static electricity and is connected to the first metallic layer 123, the second conductive terminal 1250 carries negative static electricity and is connected to the second metallic layer 125, and both of the first metallic layer 123 and the second metallic layer 125 are electrically connected to the first active layer 121. In this case, because an orthographic projection of the first metallic layer 123 on the base substrate 110 and an orthographic projection of the second metallic layer 125 on the base substrate 110 are at least partly overlapped with an orthographic projection of the first active layer 121 on the base substrate 110, respectively, the positive static electricity on the first metallic layer 123 accumulates electrons on a surface of the first active layer 121 (e.g., a surface close to the first metallic layer), so as to form a channel like TFT NMOS (N-type metal oxide semiconductor), and the negative static electricity on the second metallic layer 125 accumulates holes on the surface of the first active layer 121 (e.g., the surface close to the first metallic layer), so as to form a channel like TFT PMOS (P-type metal oxide semiconductor); in this way, the first active layer 121 itself is given with increased conductivity. Therefore, the positive static electricity on the first metallic layer 123 and the negative static electricity on the second metallic layer 125 would be guided to the first active layer 121 having larger area, so as to discharge and neutralize the static electricity on the first conductive terminal 1230 and the second conductive terminal 1250 more heavily and quickly.

For example, upon the ESD (static electricity) being at a high level (e.g., the ESD is greater than 300V and smaller than 1000V), as illustrated in FIG. 1 and FIG. 2A, the first conductive terminal 1230 carries positive static electricity and is connected to the first metallic layer 123, the second conductive terminal 1250 carries negative static electricity and is connected to the second metallic layer 125, and both of the first metallic layer 123 and the second metallic layer 125 are electrically connected to the first active layer 121. In this case, the positive static electricity on the first metallic layer 123 accumulates more electrons on the surface of the first active layer 121, while the negative static electricity on the second metallic layer 125 accumulates more holes on the surface of the first active layer 121; in this way, the first active layer 121 itself is given with increased conductivity. Therefore, the positive static electricity on the first metallic layer 123 and the negative static electricity on the second metallic layer 125 would be guided, at larger amount, to the first active layer 121 having larger area, so as to discharge and neutralize the static electricity on the first conductive terminal 1230 and the second conductive terminal 1250 more heavily and quickly.

Therefore, the ESD protection circuit can provide a new type of ESD protection circuit which can be used for ESD protection of a multi-layered structure. Furthermore, the ESD protection circuit is provided with a plurality of input ports (first conductive terminals and second conductive terminals of the plurality of first ESD units), is capable of performing electrostatic discharge and electrostatic neutralization quickly, and possesses advantages including active electrostatic discharge, equally two-way through property, and adaptability for electrostatic discharge of various specifications (voltages).

For example, the first conductive terminal and the first connection terminal can be connected through a via hole and a conductive connection layer in the via hole in the first insulating layer and the second insulating layer; the second conductive terminal and the first connection terminal can be connected through the via hole and the conductive connection layer in the via hole in the first insulating layer and the second insulating layer. The conductive connection layer includes a source-drain electrode layer, so as to be connected with conductive structures such as source-drain electrode and pixel electrode, thereby performing electrostatic discharge and electrostatic neutralization on the source-drain electrode and the pixel electrode and further improving the capability of electrostatic discharge of the ESD protection circuit.

For instance, in some examples, as illustrated in FIG. 2A and FIG. 2B, the first metallic layer 123 includes a plurality of first strip portions 1231; the second metallic layer 125 includes a plurality of second strip portions 1251; and orthographic projections of the plurality of first strip portions 1231 on the base substrate 110 are alternately arranged with orthographic projections of the plurality of second strip portions 1251 on the base substrate 110. This facilitates positive static electricity on the first metallic layer 123 to accumulate electrons on the surface of the first active layer 121 so as to form a channel like TFT NMOS (N-type metal-oxide semiconductor); and facilitates negative static electricity on the second metallic layer 125 to accumulate holes on the surface of the first active layer 121 so as to form a channel like TFT PMOS (P-type metal-oxide semiconductor).

For instance, in some examples, the ESD protection circuit further includes an interlayered insulating layer 126 disposed at a side of the second metallic layer 125 away from the base substrate 110.

For instance, in some examples, as illustrated in FIG. 1, an angle is formed between an extension direction of the first conductive terminal 1230 and an extension direction of the second conductive terminal 1250, and the angle is in the range of 30-90 degrees. Thus, upon a main body of the first active layer 121 having a substantially square shape (polygon), the first conductive terminal 1230 and the second conductive terminal 1250 having different extension directions would not interfere with each other, and would be electrically connected with different first connection terminals 1210. It should be explained that, the above-mentioned extension direction of the first conductive terminal refers to the direction along which the first conductive terminal extends outwardly from a main body of the first metallic layer; likewise, the above-mentioned extension direction of the second conductive terminal refers to the direction along which the second conductive terminal extends outwardly from a main body of the second metallic layer.

Correspondingly, an angle is also formed between an extension direction of the first connection terminal 1210 connected with the first conductive terminal 1230 and an extension direction of the second connection terminal 1210 connected with the second conductive terminal 1250, and the angle is in the range of 30-90 degrees.

For instance, in some examples, the angle is 90 degrees, so as to further prevent from any mutual interference between the first conductive terminal 1230 and the second conductive terminal 1250.

For instance, in some examples, as illustrated in FIG. 1, the plurality of first ESD units 120 are arranged along an extension direction of a closed line, i.e., the first ESD units 120 are arranged along a closed line trace, and each of the first ESD units 120 is located at one of vertex angels of a first polygonal ring formed by the plurality of first ESD units 120.

For instance, in some examples, because the vertex angle of the first polygonal ring is happened to be adjacent to two sides of the first polygonal ring, it's possible that the extension direction of the first conductive terminal 1230 and the extension direction of the second conductive terminal 1250 in the first ESD unit 120 can extend along directions perpendicular to the two edges, respectively; that is, the extension direction of the first conductive terminal 1230 and the extension direction of the second conductive terminal 1250 are respectively perpendicular to two edges of the vertex angle where the first ESD unit 120 is located, in the first polygonal ring, so as to prevent from any mutual interference between the first conductive terminal 1230 and the second conductive terminal 1250.

For instance, in some examples, as illustrated in FIG. 1, the number of the plurality of first ESD units 120 is four, and the first polygonal ring is a rectangular ring. In such case, the angle between the extension direction of the first conductive terminal 1230 and the extension direction of the second conductive terminal 1250 is 90 degrees.

Figure 2C:
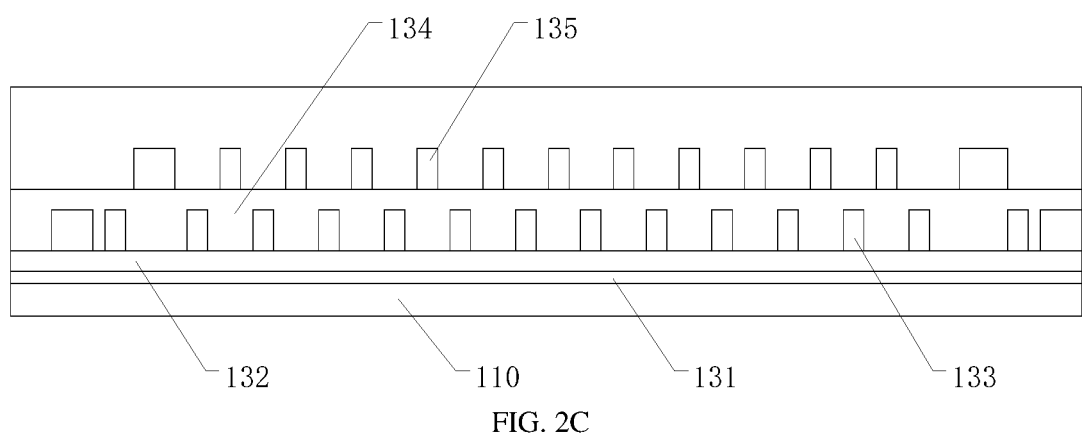
FIG. 2C is a cross-sectional view of an ESD protection circuit provided by an embodiment of the present disclosure taken along EF direction of FIG. 1.

For instance, in some examples, as illustrated in FIG. 1 and FIG. 2C, the ESD protection circuit further includes a plurality of second ESD units 130 disposed on the base substrate 110. Each of the second ESD units 130 includes a second active layer 131 disposed on the base substrate 110; a third insulating layer 132 disposed at a side of the second active layer 131 away from the base substrate 110; a third metallic layer 133 disposed at a side of the third insulating layer 132 away from the base substrate 110; a fourth insulating layer 134 disposed at a side of the third metallic layer 133 away from the base substrate 110; and a fourth metallic layer 135 disposed at a side of the fourth insulating layer 134 away from the base substrate 110. The second active layer 131 includes a plurality of second connection terminals 1310 located at an edge of the second active layer 131.

The second ESD unit is different from the first ESD unit in that, the third metallic layer 133 includes a plurality of third conductive terminals 1330 located at an edge of the third metallic layer 133, or, the fourth metallic layer 135 includes a plurality of fourth conductive terminals 1350 located at an edge of the fourth metallic layer 135; that is to say, only one of the third metallic layer 133 and the fourth metallic layer 135 is provided with the conductive terminals (the plurality of third conductive terminals 1330 or the plurality of fourth conductive terminals 1350). An orthographic projection of the third metallic layer 133 on the base substrate 110 and an orthographic projection of the fourth metallic layer 135 on the base substrate 110 are at least partly overlapped with an orthographic projection of the second active layer 131 on the base substrate 110, respectively; and the third conductive terminals 1330 or the fourth conductive terminals 1350 are electrically connected with the second connection terminals 1310, respectively.

In the ESD protection circuit provided by the present embodiment, the third conductive terminal 1330 or the forth conductive terminal 1350 can be connected with one ESD port so as to guide the static electricity at this ESD port to the second ESD unit 130 for electrostatic discharge; for example, guiding the static electricity at this ESD port to the second active layer 131 of the second ESD unit 130 for electrostatic discharge. At this time, the plurality of third conductive terminals 1330 or the plurality of forth conductive terminals 1350 of the second ESD units can be used as ports connected with the ESD ports and configured for discharging the static electricity. As a result, in addition to the first ESD unit, the second ESD unit can also discharge the static electricity so as to increase the number of the ESD ports and the ESD capability of the ESD protection circuit. It should be explained that, the working principle of the second ESD unit is similar to that of the first ESD unit, and is also applicable for electrostatic discharge of various specifications (including the cases where the ESD is at low level, middle level and high level, as described above), except that the second ESD unit is only connected to one ESD port for performing electrostatic discharge without electrostatic neutralization.

For instance, in some examples, as illustrated in FIG. 1, the ESD protection circuit includes four first ESD units and four second ESD units, and can provide twelve ports connected with the ESD port, in total. Of course, the embodiments of the present disclosure include such case but are not limited thereto, and the ESD protection circuit can further include more first ESD units and more second ESD units.

For instance, in some examples, the first active layer 121 and the second active layer 131 are two portions of a same active layer pattern; that is to say, the first active layer 121 and the second active layer 131 can be formed by patterning a same active layer, and the first active layer 121 and the second active layer 131 are an integrally formed structure. The first insulating layer 122 and the third insulating layer 132 are two portions of a same insulating layer patter; that is to say, the first insulating layer 122 and the third insulating layer 132 can be formed by patterning a same insulating layer, and the first insulating layer 122 and the third insulating layer 132 are an integrally formed structure; of course, the first insulating layer 122 and the third insulating layer 132 can also be insulating layers completely covering a surface of the base substrate. The first metallic layer 123 and the third metallic layer 133 are two portions of a same metallic layer patter; that is to say, the first metallic layer 123 and the third metallic layer 133 can be formed by patterning a same metallic layer, and the first metallic layer 123 and the third metallic layer 133 are an integrally formed structure. The second insulating layer 124 and the fourth insulating layer 134 are two portions of a same insulating layer patter; that is to say, the second insulating layer 124 and the fourth insulating layer 134 can be formed by patterning a same insulating layer, and the second insulating layer 124 and the fourth insulating layer 134 are an integrally formed structure; of course, the second insulating layer and the fourth insulating layer can also be insulating layers completely covering the surface of the base substrate. The second metallic layer 125 and the fourth metallic layer 135 are two portions of a same metallic layer patter; that is to say, the second metallic layer 125 and the fourth metallic layer 135 can be formed by patterning a same metallic layer, and the second metallic layer 125 and the fourth metallic layer 135 are an integrally formed structure. In this way, on one aspect, the ESD protection circuit provided by the present embodiment can simplify the manufacturing process and save the cost; on the other aspect, the first active layer and the second active layer can be integrated into one layer having a relatively larger area, so as to increase the capability of electrostatic discharge and electrostatic neutralization. Of course, the embodiments of the present disclosure include such case but are not limited thereto, and the above-described structural layers can also be formed in different layers.

For instance, in some examples, as illustrated in FIG. 1, the plurality of first ESD units 120 and the plurality of second ESD units 130 are alternately arranged along an extension direction of a closed line, that is, they are alternately arranged along a closed line trace, so as to considerably utilize the space and reduce an area occupied by the ESD protection circuit.

For instance, in some examples, as illustrated in FIG. 1, upon each of the first ESD units 120 being located at a vertex angle of a second polygonal ring formed by the plurality of first ESD units 120 and the plurality of second ESD units 130, each of the second ESD units 130 is located at a side of the second polygonal ring. In this way, on one aspect, the ESD protection circuit allows the extension direction of the first conductive terminal 1230 and the extension direction of the second conductive terminal 1250 of the first ESD unit 120 to be extending along directions perpendicular to two sides, respectively; that is, the extension direction of the first conductive terminal 1230 and the extension direction of the second conductive terminal 1250 are respectively perpendicular to two edges of the vertex angle where the first ESD unit 120 is located, in the first polygonal ring, so as to prevent from any mutual interference between the first conductive terminal 1230 and the second conductive terminal 1250; moreover, it's also possible to allow the extension direction of the third conductive terminal 1330 or the extension direction of the fourth conductive terminal 1350 of the second ESD unit 130 to be perpendicular to the side of the second polygonal ring, so as to considerably utilize the space and reduce the area occupied by the ESD protection circuit.

Figure 3:
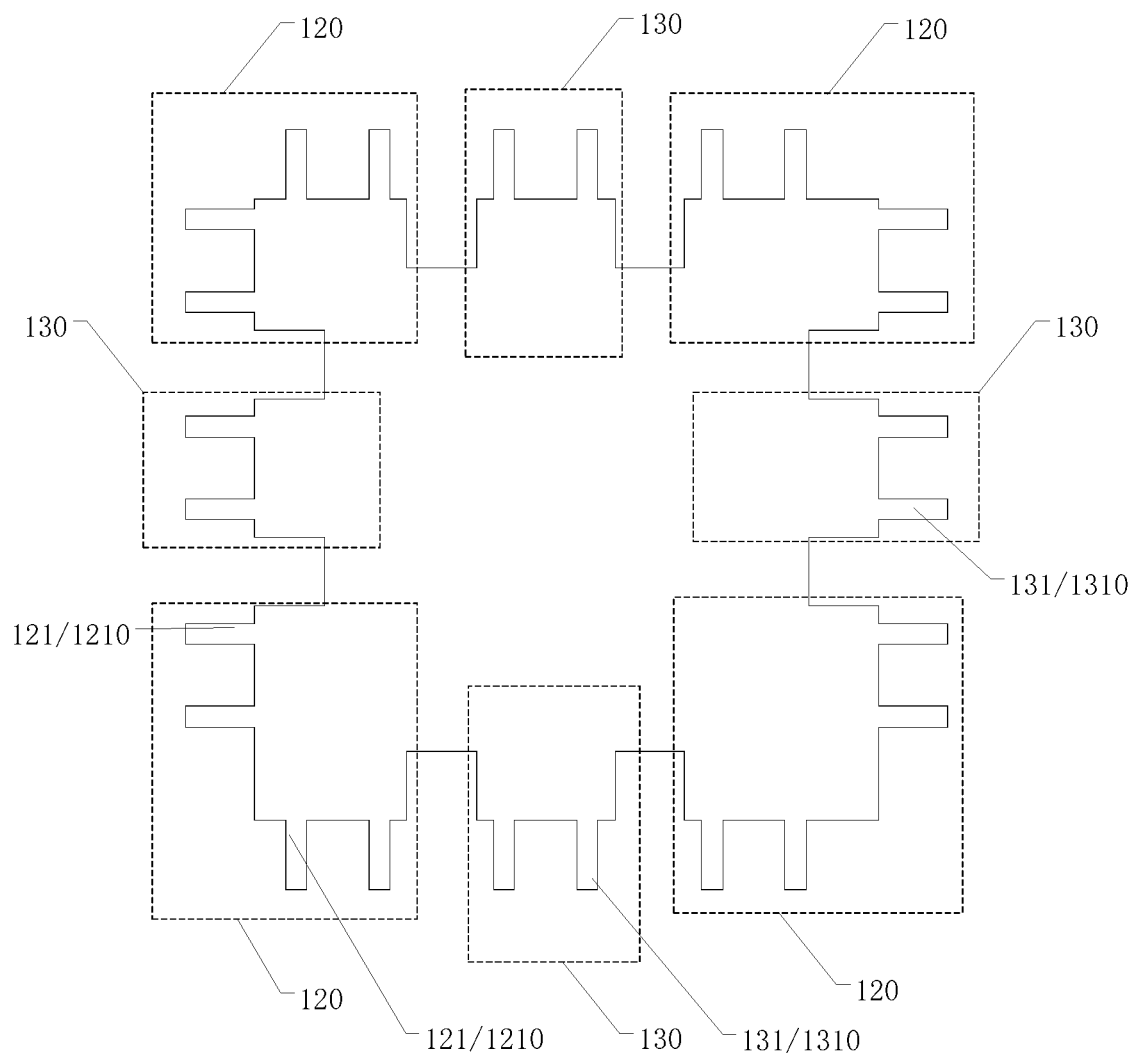
FIG. 3 is a plan view illustrating a first active layer and a second active layer in an ESD protection circuit provided by an embodiment of the present disclosure.
Figure 4:
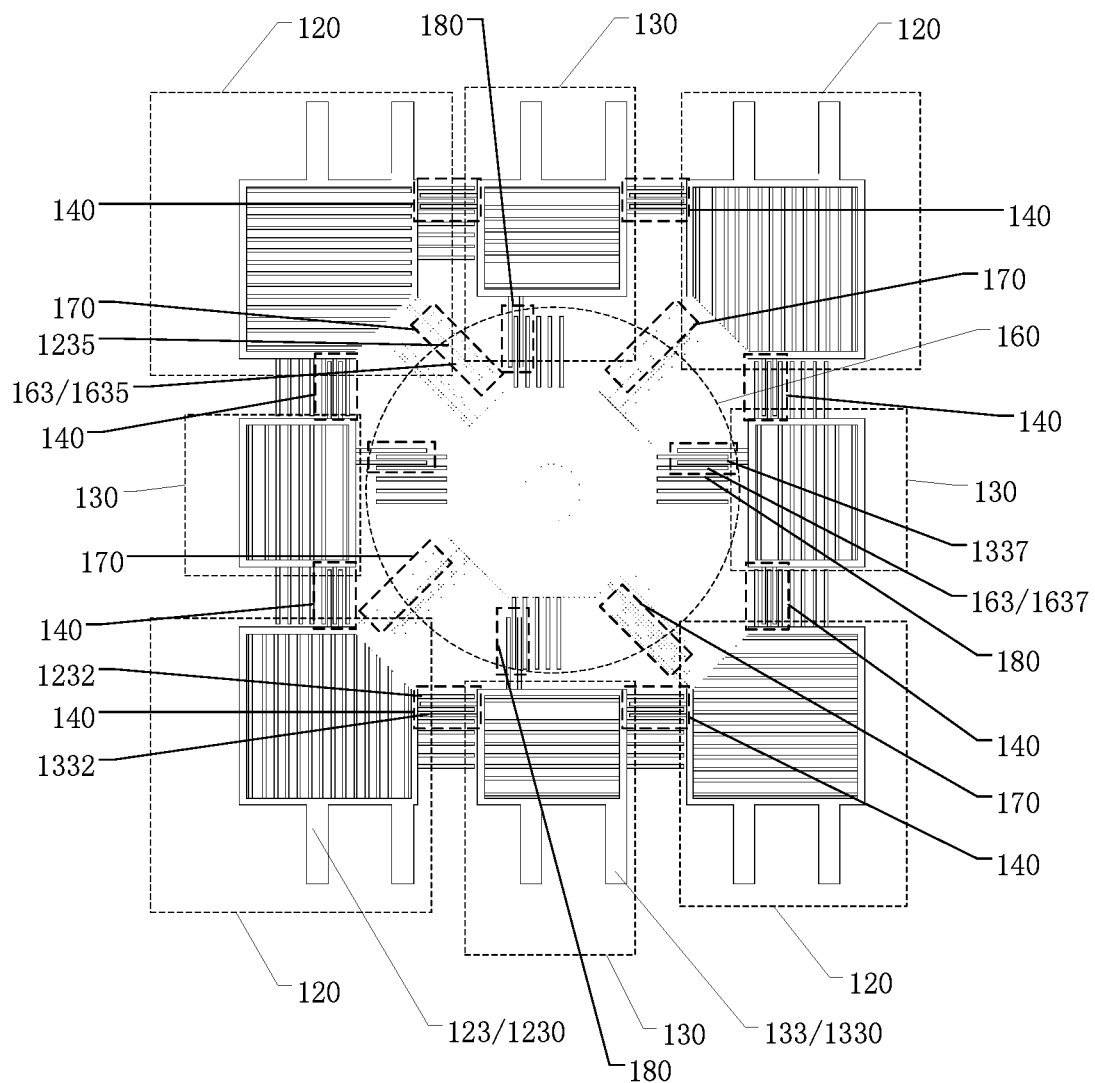
FIG. 4 is a plan view illustrating a first metallic layer and a third metallic layer in an ESD protection circuit provided by an embodiment of the present disclosure.
Figure 5:
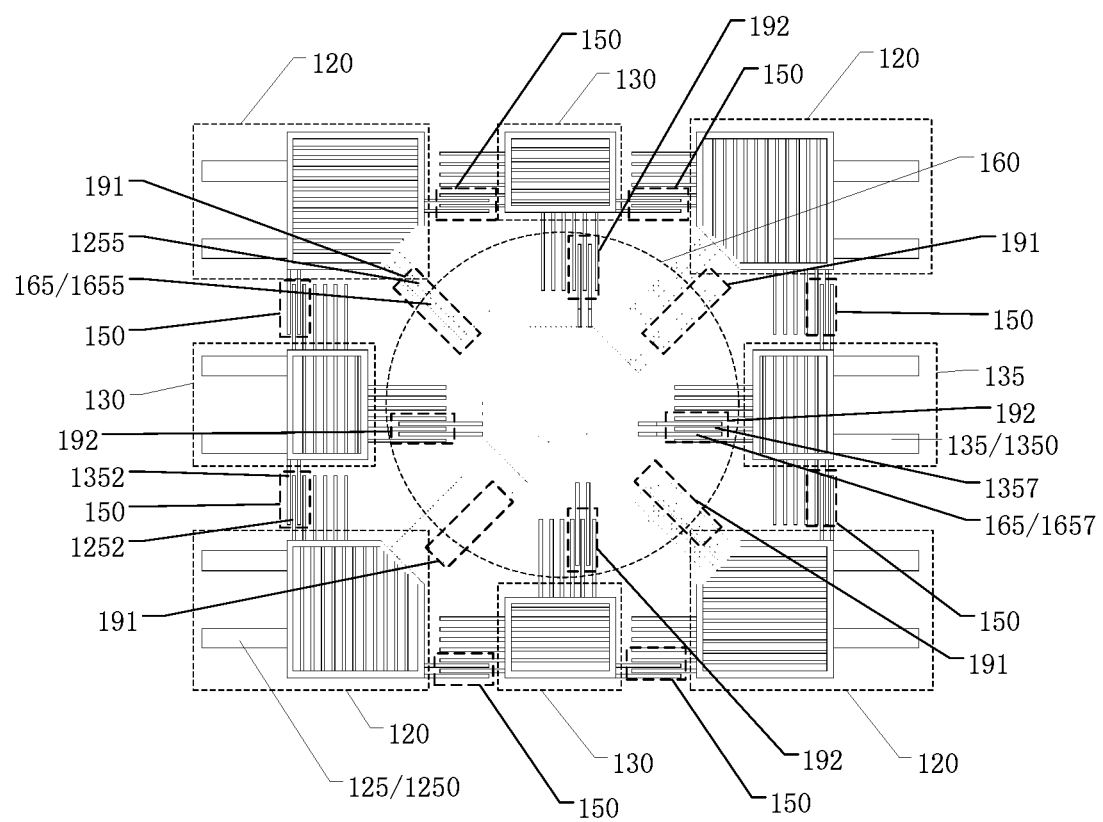
FIG. 5 is a plan view illustrating a second metallic layer and a fourth metallic layer in an ESD protection circuit provided by an embodiment of the present disclosure.
Figure 6:
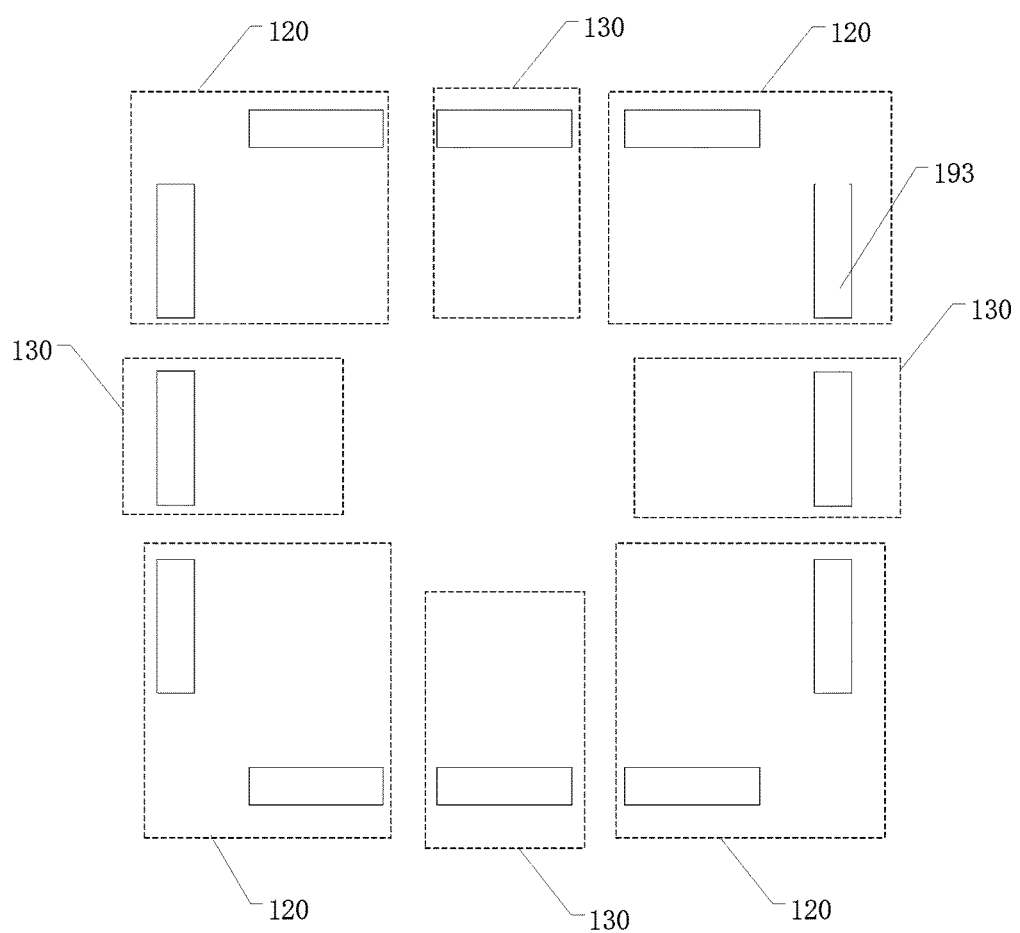
FIG. 6 is a cross-sectional view of an ESD protection circuit provided by an embodiment of the present disclosure taken along CD direction of FIG. 1.
Figure 7:
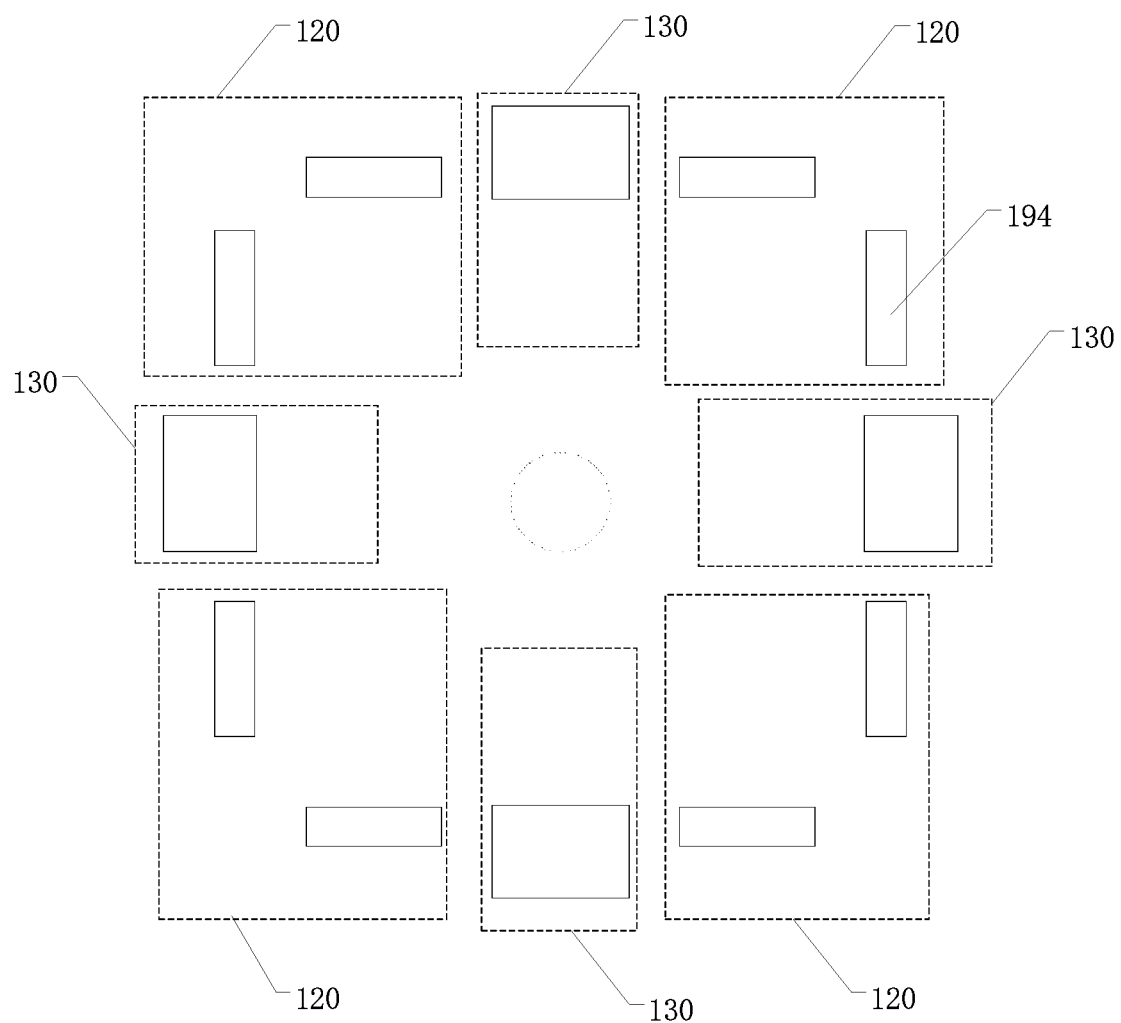
FIG. 7 is a plan view illustrating a via hole in an ESD protection circuit provided by an embodiment of the present disclosure.
Figure 8:
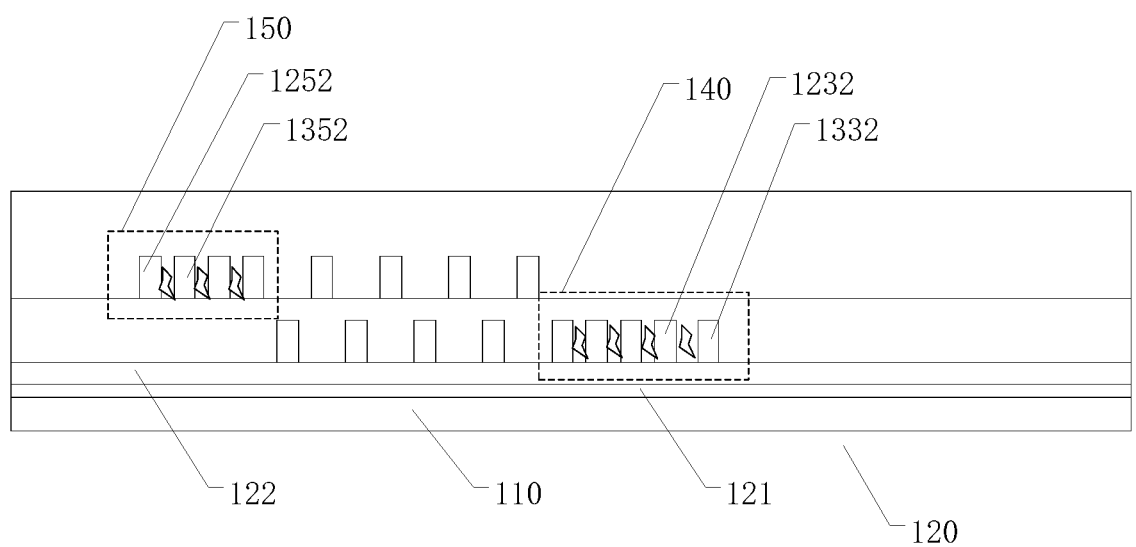
FIG. 8 is a plan view illustrating a conductive connection layer in an ESD protection circuit provided by an embodiment of the present disclosure.

FIG. 3 is a plan view illustrating a first active layer and a second active layer in an ESD protection circuit provided by an embodiment of the present disclosure; FIG. 4 is a plan view illustrating a first metallic layer and a third metallic layer in an ESD protection circuit provided by an embodiment of the present disclosure; FIG. 5 is a plan view illustrating a second metallic layer and a fourth metallic layer in an ESD protection circuit provided by an embodiment of the present disclosure; FIG. 6 is a cross-sectional view of an ESD protection circuit provided by an embodiment of the present disclosure taken along CD direction of FIG. 1; FIG. 7 is a plan view illustrating a via hole in an ESD protection circuit provided by an embodiment of the present disclosure; and FIG. 8 is a plan view illustrating a conductive connection layer in an ESD protection circuit provided by an embodiment of the present disclosure.

For instance, in some examples, as illustrated in FIG. 3, the first active layer 121 and the second active layer 131 are integrated into a same active layer pattern, and the active layer pattern is further disposed at a central region of a second polygonal ring formed by a plurality of first ESD units 120 and a plurality of second ESD units 130, so as to increase the areas of the first active layer 121 and the second active layer 131, and further improve the capability of electrostatic discharge and electrostatic neutralization of the first active layer 121 and the second active layer 131.

For instance, in some examples, as illustrated in FIG. 4, in the first ESD unit 120 and the second ESD unit 130 that are adjacent to each other, the first metallic layer 123 of the first ESD unit 120 and the third metallic layer 133 of the second ESD unit 130 respectively include a first tip portion 1232 and a third tip portion 1332 which are alternately arranged, the first tip portion 1232 and the third tip portion 1332 are insulated from each other to form a third ESD unit 140. For example, the first tip portion 1232 and the third tip portion 1332 can be insulated from each other through the second insulating layer disposed on the first metallic layer 123. In this way, the third ESD unit 140 formed by the first tip portion 1232 and the third tip portion 1332 can provide a structure having point discharge function, so as to passively discharge the ESD (static electricity) with higher voltage, and further to improve the capability of electrostatic discharge of the ESD protection circuit.

For instance, as illustrated in FIG. 4, the first metallic layer 123 of the first ESD unit 120 and the third metallic layer 133 of the second ESD unit 130 are disposed in a same layer and can be formed by patterning a same metallic layer.

For instance, in some examples, as illustrated in FIG. 5, in the first ESD unit 120 and the second ESD unit 130 that are adjacent to each other, the second metallic layer 125 of the first ESD unit 120 and the fourth metallic layer 135 of the second ESD unit 130 respectively include a second tip portion 1252 and a fourth tip portion 1352 which are alternately arranged, the second tip portion 1252 and the fourth tip portion 1352 are insulated from each other to form a fourth ESD unit 150. In this way, the fourth ESD unit 150 formed by the second tip portion 1252 and the fourth tip portion 1352 can provide a structure having point discharge function, so as to passively discharge the ESD (static electricity) with higher voltage, and further to improve the capability of electrostatic discharge of the ESD protection circuit.

For example, as illustrated in FIG. 5, the second metallic layer 125 of the first ESD unit 120 and the fourth metallic layer 135 of the second ESD unit 130 are disposed in a same layer and can be formed by patterning a same metallic layer.

For example, upon the ESD (static electricity) being at super-high level (e.g., the ESD is greater than 1000V), on one aspect, for the first ESD unit 120, electrons on the outermost layer of the first active layer 121 would be ionized and moved to generate more electrons and holes because of the high level drive of the static electricity on the first metallic layer 123 and the second metallic layer 125, which results in a current path, further increases the conductivity of the first active layer 121, and leads to more obvious neutralization effect of the positive and negative static electricity of the first metallic layer 123 and the second metallic layer 125 on the first active layer 121; on the other aspect, as illustrated in FIG. 6, if the ESD (static electricity) subjected to the above-described discharge and neutralization still has relatively higher level (e.g., ESD is greater than 1000V), it can perform point discharge through at least one of the third ESD unit 140 formed by the first tip point 1232 and the third tip point 1332 and the fourth ESD unit 150 formed by the second tip portion 1252 and the fourth tip portion 1352, so as to further improve the capability of electrostatic discharge of the ESD protection circuit.

It should be explained that, a relatively smaller distance between the first tip point 1232 and the third tip point 1332 in the third ESD unit 140 allows for a point discharge to be easily occurred. For instance, in some examples, a distance between the third ESD unit and the fourth ESD unit is greater than 2 times of a distance between the first tip portion and the third tip portion.

For instance, in some examples, as illustrated in FIG. 4 and FIG. 5, the ESD protection circuit further includes a central ESD structure 160 located at a center of the second polygon ring. The central ESD structure 160 includes: a fifth metallic layer 163 disposed in a same layer with the first metallic layer 123; and a sixth metallic layer 165 disposed in a same layer with the second metallic layer 125. In the first ESD unit 120 and the central ESD structure 160 that are adjacent to each other, the first metallic layer 123 of the first ESD unit 120 and the fifth metallic layer 163 of the central ESD structure 160 respectively include a fifth tip portion 1235 and a sixth tip portion 1635 which are alternately arranged, and the fifth tip portion 1235 and the sixth tip portion 1635 are insulated from each other to form a fifth ESD unit 170. The working principle of the fifth ESD unit 170 is similar with that of the third ESD unit and the fourth ESD unit described above, and the fifth ESD unit 170 can also utilize the principle of point discharge to discharge the ESD (static electricity) with higher voltage (e.g., the ESD is greater than 1000V), so as to further improve the capability of electrostatic discharge of the ESD protection circuit.

For instance, in some examples, as illustrated in FIG. 4 and FIG. 5, in the second ESD unit 130 and the central ESD structure 160 that are adjacent to each other, the third metallic layer 133 of the second ESD unit 130 and the fifth metallic layer 163 of the central ESD structure 160 respectively include a seventh tip portion 1337 and an eighth tip portion 1637 which are alternately arranged, the seventh tip portion 1337 and the eighth tip portion 1637 are insulated from each other to form a sixth ESD unit 180. The working principle of the sixth ESD unit 180 is similar with that of the third ESD unit and the fourth ESD unit described above, and the sixth ESD unit 180 can also utilize the principle of point discharge to discharge the ESD (static electricity) with higher voltage (e.g., the ESD is greater than 1000V), so as to further improve the capability of electrostatic discharge of the ESD protection circuit.

For instance, in some examples, as illustrated in FIG. 4 and FIG. 5, in the first ESD unit 120 and the central ESD structure 160 that are adjacent to each other, the second metallic layer 125 of the first ESD unit 120 and the sixth metallic layer 165 of the central ESD structure 160 respectively include a ninth tip portion 1255 and a tenth tip portion 1655 which are alternately arranged, the ninth tip portion 1255 and the tenth tip portion 1655 are insulated from each other to form a seventh ESD unit 191. The working principle of the seventh ESD unit 191 is similar with that of the third ESD unit and the fourth ESD unit described above, and the seventh ESD unit 191 can also utilize the principle of point discharge to discharge the ESD (static electricity) with higher voltage (e.g., the ESD is greater than 1000V), so as to further improve the capability of electrostatic discharge of the ESD protection circuit.

For instance, in some examples, as illustrated in FIG. 4 and FIG. 5, in the second ESD unit 130 and the central ESD structure 160 that are adjacent to each other, the fourth metallic layer 135 of the second ESD unit 130 and the sixth metallic layer 165 of the central ESD structure 160 respectively include an eleventh tip portion 1357 and a twelfth tip portion 1657 which are alternately arranged, and the eleventh tip portion 1357 and the twelfth tip portion 1657 are insulated from each other to form an eighth ESD unit 192. The working principle of the eighth ESD unit 192 is similar with that of the third ESD unit and the fourth ESD unit described above, and the eighth ESD unit 192 can also utilize the principle of point discharge to discharge the ESD (static electricity) with higher voltage (e.g., the static electricity is greater than 1000V), so as to further improve the capability of electrostatic discharge of the ESD protection circuit.

For instance, in some examples, as illustrated in FIG. 7 and FIG. 8, the ESD protection circuit includes a via hole and a conductive connection layer 194 disposed in the via hole 193 to electrically connect the first conductive terminal 1230, the second conductive terminal 1250, the third conductive terminal 1330 and the fourth conductive terminal 1350 with the active layer pattern through the first connection terminal 1210 and the second connection terminal 1310, respectively. For example, the conductive connection layer can be a source-drain electrode layer so that the conductive connection layer can also perform electrostatic discharge and electrostatic neutralization to further improve the capability of electrostatic discharge of the ESD protection circuit.

Figure 9:
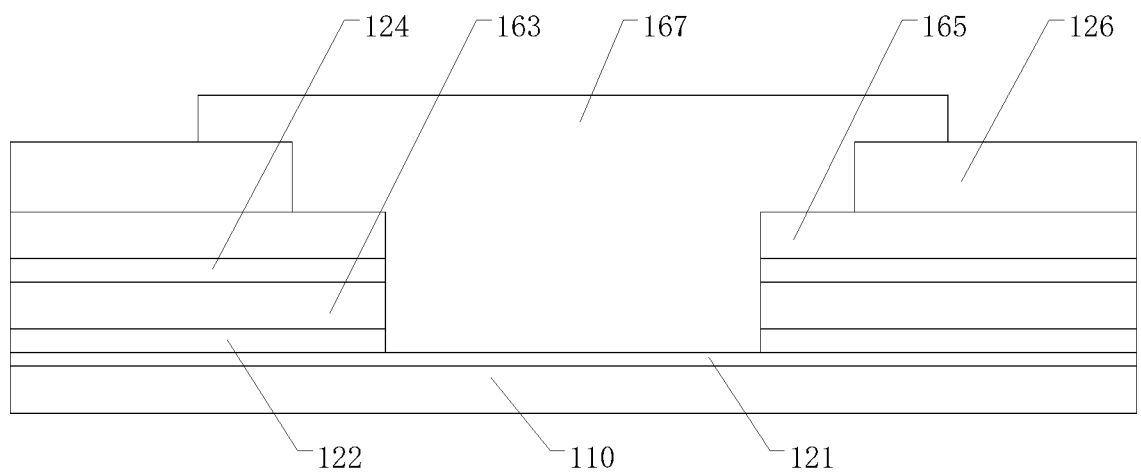
FIG. 9 is a structural view illustrating a central conductive structure in an ESD protection circuit provided by an embodiment of the present disclosure.
Figure 10:
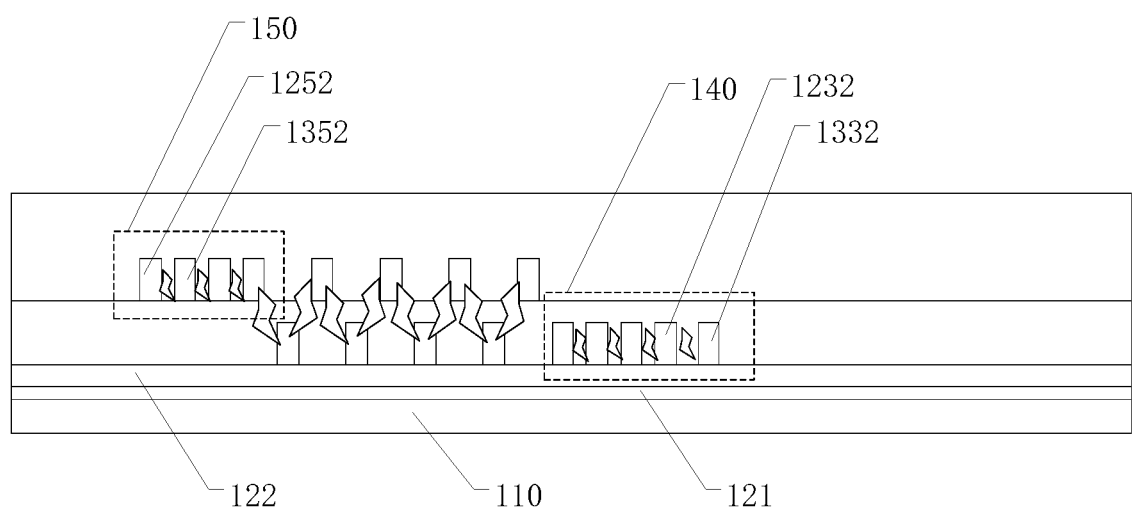
FIG. 10 is a cross-sectional view of another ESD protection circuit provided by an embodiment of the present disclosure taken along CD direction of FIG. 1.

FIG. 9 is a structural view illustrating a central conductive structure in an ESD protection circuit provided by an embodiment of the present disclosure; and FIG. 10 is a cross-sectional view of another ESD protection circuit provided by an embodiment of the present disclosure taken along CD direction of FIG. 1.

For instance, in some examples, as illustrated in FIG. 9, the central ESD structure further includes a central conductive structure 167, namely a discharge tower, which is electrically connected with the first active layer 121, the fifth metallic layer 163 and the sixth metallic layer 165, respectively. That is to say, the central conductive structure 167 is electrically connected to a layer where the first active layer 121 is located, a layer where the fifth metallic layer 163 is located, and a layer where the sixth metallic layer 165 is located, respectively. In this way, the static electricity on any of the first active layer 121, the fifth metallic layer 163 and the sixth metallic layer 165 can be guided to the other layers of the first active layer 121, the fifth metallic layer 163 and the sixth metallic layer 165 for electrostatic discharge and electrostatic neutralization, so as to further improve the capability of electrostatic discharge of the ESD protection circuit. Referring to FIG. 1, the central conductive structure 167 is located in the center of the central ESD structure.

For example, as illustrated in FIG. 9, the central conductive structure 167 can be electrically connected to the first active layer 121, the fifth metallic layer 163 and the sixth metallic layer 165 through the via hole exposing the layer where the first active layer 121 is located, the via hole penetrating the layer where the fifth metallic layer is located, and the via hole penetrating the layer where the sixth metallic layer is located, respectively.

It should be explained that, in a case where the first active layer 121 and the second active layer 131 are formed by patterning a same active layer, in a case where the first metallic layer 123, the third metallic layer 133 and the fifth metallic layer 163 are formed by patterning a same metallic layer, and in a case where the second metallic layer 125, the fourth metallic layer 135 and the sixth metallic layer 165 are formed by patterning a same metallic layer, the central conductive structure 167 also electrically connects the second active layer 131, the first metallic layer 123, the third metallic layer 133, the second metallic layer 125 and the fourth metallic layer 135. Moreover, in a case where the ESD protection circuit includes a via hole and a conductive connection layer 194 disposed in the via hole 193, the central conductive structure 167 is also electrically connected with the conductive connection layer 194.

For example, as illustrated in FIG. 10, upon the ESD (static electricity) being at super-high level (e.g., the ESD is greater than 1000V), strip electrodes in different layers between the third ESD unit 140 and the fourth ESD unit 150 adjacent to the third ESD unit 140 can also perform point discharge because of the effect of the central conductive structure 167, so as to further improve the capability of electrostatic discharge of the ESD protection circuit. Of course, the embodiments of the present disclosure include such case but are not limited thereto; upon the ESD (static electricity) being at super-high level, because the central conductive structure 167 electrically connects all of the layer where the first metallic layer 123 is located, the layer where the second metallic layer 133 is located, and the layer where the conductive connection layer 194 is located, a passive electrostatic discharge can be performed between any adjacent conductive layers.

Likewise, the point discharge can be performed between the fifth ESD unit 170 and the seventh ESD unit 191 that are adjacent to each other, and also between the sixth ESD unit 180 an the eighth ESD unit 192 that are adjacent to each other, so as to further improve the capability of electrostatic discharge of the ESD protection circuit.

Moreover, the first ESD unit 120, the second ESD unit 130, the third ESD unit 140, the fourth ESD unit 150, the fifth ESD unit 170, the sixth ESD unit 180, the seventh ESD unit 191, the eighth ESD unit 192 and the central conductive structure 167 are intensively disposed within the range of the second polygonal ring in the ESD protection circuit by a considerable layout, so as to ensure the integration level of the ESD protection circuit while improving the capability of electrostatic discharge of the ESD protection circuit.

An embodiment of the present disclosure further provides an array substrate including the ESD protection circuit provided by any of the embodiments or examples above. Therefore, the array substrate possesses relatively higher capability of electrostatic discharge protection, so as to avoid any damage attributed to electrostatic discharge during manufacture, transportation and usage, thereby increasing the product yield and the service life.

Figure 11:
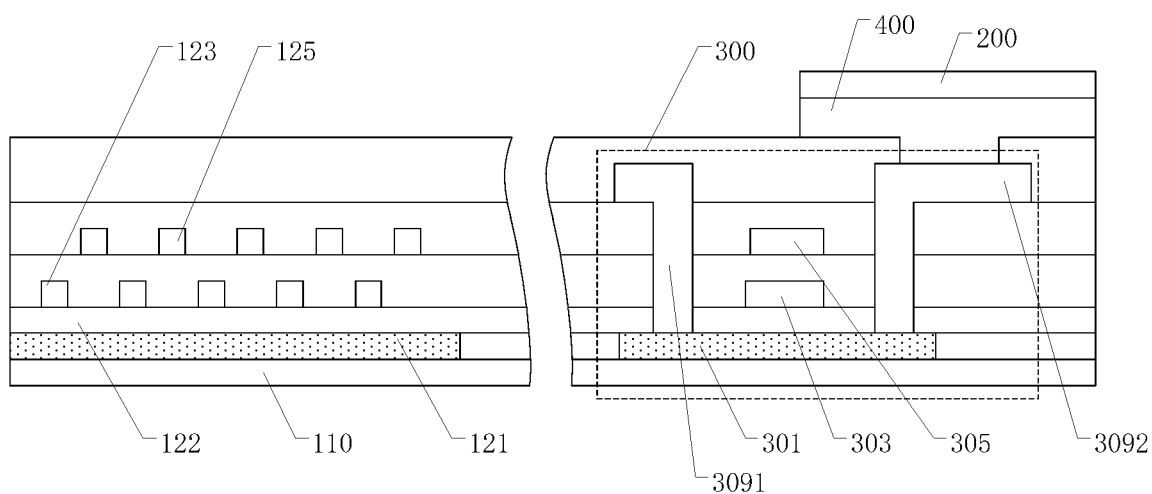
FIG. 11 is a structural view illustrating an array substrate provided by an embodiment of the present disclosure.

FIG. 11 is a structural view illustrating an array substrate provided by an embodiment of the present disclosure. As illustrated in FIG. 11, in some examples, the array substrate can further include an organic light-emitting layer 200 and a thin film transistor (TFT) unit 300. In such case, the first active layer 121 and an active layer 301 of the TFT unit 300 are located in a same layer; the first metallic layer 123 and a first gate electrode 303 in the TFT unit 300 are located in a same layer; and the second metallic layer 125 and a second gate electrode 305 in the TFT unit 300 are located in a same layer. That is to say, the manufacturing process of the ESD protection circuit can be integrated in a manufacturing process of an array substrate of an OLED device without adding new Mask technical process, so as to reduce the manufacturing cost of the array substrate.

For example, as illustrated in FIG. 11, the TFT unit 300 further includes an active layer 301, and the first active layer 121 and the active layer 301 can be formed by patterning a same active layer.

For example, as illustrated in FIG. 11, the array substrate can further include: a source electrode 3091 and a drain electrode 3092 which are connected to the active layer 301 of the TFT unit 300; and an anode electrode 400 connected to the drain electrode 3092. The anode electrode 400 is connected to the organic light-emitting layer 200 to drive the organic light-emitting layer 200 to emit light.

Of course, the embodiments of the present disclosure include such case but are not limited thereto, and the array substrate can also be an array substrate of a liquid crystal display device.

An embodiment of the present disclosure further provides a display device including the array substrate provided by any of the embodiments or examples above. Therefore, the display device possesses relatively higher capability of electrostatic discharge protection, so as to avoid any damage attributed to electrostatic discharge during manufacture, transportation and usage, thereby increasing the product yield and the service life.

For instance, in some examples, the display device can be any product or component having display function, such as television, computer, mobile phone, digital camera, digital photo frame, navigator device, watch, tablet computer and notebook computer.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments of the present disclosure can be combined.

The above are only specific implementations of the present disclosure, and the protection scope of the present disclosure is not limited thereto. Any modifications or substitutions easily occur to those skilled in the art within the technical scope of the present disclosure should be fallen within the protection scope of the present disclosure. Therefore, the protection scope of the present disclosure should be based on the protection scope of the claims and the equivalents thereof.

What is claimed is:

1. An electrostatic discharge (ESD) protection circuit, comprising:
    a base substrate; and
    a plurality of first ESD units on the base substrate,
    wherein each of the plurality of first ESD units comprises:
        a first active layer disposed on the base substrate; a first insulating layer disposed at a side of the first active layer away from the base substrate; a first metallic layer disposed at a side of the first insulating layer away from the base substrate; a second insulating layer disposed at a side of the first metallic layer away from the base substrate; and a second metallic layer disposed at a side of the second insulating layer away from the base substrate,
    the first active layer comprises a plurality of first connection terminals; the first metallic layer comprises a plurality of first conductive terminals; the second metallic layer comprises a plurality of second conductive terminals; an orthographic projection of the first metallic layer on the base substrate and an orthographic projection of the second metallic layer on the base substrate are at least partly overlapped with an orthographic projection of the first active layer on the base substrate, respectively; and the plurality of first conductive terminals and the plurality of second conductive terminals are electrically connected with different ones of the plurality of first connection terminals, respectively.

2. The ESD protection circuit according to claim 1, wherein the first metallic layer comprises a plurality of first strip portions, the second metallic layer comprises a plurality of second strip portions, and
    orthographic projections of the plurality of first strip portions on the base substrate are arranged alternately with orthographic projections of the plurality of second strip portions on the base substrate.

3. The ESD protection circuit according to claim 1, wherein the first conductive terminals and the second conductive terminals are configured to be electrically connected with ESD ports, respectively, and
    static electricity at the ESD ports connected with the first conductive terminals has an electrical property opposite to that of static electricity at the ESD ports connected with the second conductive terminals.

4. The ESD protection circuit according to claim 1, wherein each of the plurality of first ESD units further comprises:
    a via hole, disposed in the first insulating layer and in the second insulating layer, and exposing the first active layer; and
    a conductive connection layer, disposed in the via hole to electrically connect the plurality of first conductive terminals and the plurality of second conductive terminals with different ones of the plurality of first connection terminals, respectively,
    wherein the conductive connection layer comprises a source-drain electrode layer.

5. The ESD protection circuit according to claim 1, wherein an angle is formed between an extension direction of the first conductive terminals and an extension direction of the second conductive terminals, and the angle is in a range of 30-90 degrees.

6. The ESD protection circuit according to claim 1, wherein the plurality of first ESD units are arranged along a closed line to form a first polygon ring.

7. The ESD protection circuit according to claim 6, wherein, in each of the plurality of first ESD units, an extension direction of the first conductive terminals and an extension direction of the second conductive terminals are perpendicular to two edges of a vertex angle of the first polygon ring, respectively, the first ESD unit is located at the vertex angle.

8. The ESD protection circuit according to claim 1, further comprising:
    a plurality of second ESD units disposed on the base substrate,
    wherein each of the plurality of second ESD units comprises: a second active layer disposed on the base substrate; a third insulating layer disposed at a side of the second active layer away from the base substrate; a third metallic layer disposed at a side of the third insulating layer away from the base substrate; a fourth insulating layer disposed at a side of the third metallic layer away from the base substrate; and a fourth metallic layer disposed at a side of the fourth insulating layer away from the base substrate,
    the second active layer comprises a plurality of second connection terminals located at an edge of the second active layer,
    the third metallic layer comprises a plurality of third conductive terminals located at an edge of the third metallic layer, or, the fourth metallic layer comprises a plurality of fourth conductive terminals located at an edge of the fourth metallic layer;
    an orthographic projection of the third metallic layer on the base substrate and an orthographic projection of the fourth metallic layer on the base substrate are at least partly overlapped with an orthographic projection of the second active layer on the base substrate, respectively; and the plurality of third conductive terminals or the plurality of fourth conductive terminals are electrically connected with the plurality of second connection terminals, respectively.

9. The ESD protection circuit according to claim 8, wherein the first active layer and the second active layer are two portions of a same active layer pattern,
    the first insulating layer and the third insulating layer are two portions of a same insulating layer pattern,
    the first metallic layer and the third metallic layer are two portions of a same metallic layer,
    the second insulating layer and the fourth insulating layer are two portions of a same insulating layer pattern, and
    the second metallic layer and the fourth metallic layer are two portions of a same metallic layer pattern.

10. The ESD protection circuit according to claim 8, wherein the plurality of first ESD units and the plurality of second ESD units are arranged alternately along a closed line trace to form a second polygon ring.

11. The ESD protection circuit according to claim 9, wherein, in the first ESD unit and the second ESD unit that are adjacent to each other, the first metallic layer of the first ESD unit and the third metallic layer of the second ESD unit respectively comprise a first tip portion and a third tip portion which are alternately arranged, the first tip portion and the third tip portion are insulated from each other to form a third ESD unit.

12. The ESD protection circuit according to claim 11, wherein, in the first ESD unit and the second ESD unit that are adjacent to each other, the second metallic layer of the first ESD unit and the fourth metallic layer of the second ESD unit respectively comprise a second tip portion and a fourth tip portion which are alternately arranged, the second tip portion and the fourth tip portion are insulated from each other to form a fourth ESD unit.

13. The ESD protection circuit according to claim 12, wherein a distance between the third ESD unit and the fourth ESD unit is greater than 2 times of a distance between the first tip portion and the third tip portion.

14. The ESD protection circuit according to claim 10, further comprising: a central ESD structure located at a center of the second polygon ring, wherein the central ESD unit comprises:

a fifth metallic layer disposed in a same layer with the first metallic layer; and a sixth metallic layer disposed in a same layer with the second metallic layer, wherein, in the first ESD unit and the central ESD structure that are adjacent to each other, the first metallic layer of the first ESD unit and the fifth metallic layer of the central ESD structure respectively comprise a fifth tip portion and a sixth tip portion which are alternately arranged, the fifth tip portion and the sixth tip portion are insulated from each other to form a sixth ESD unit.

15. The ESD protection circuit according to claim 14, wherein, in the second ESD unit and the central ESD structure that are adjacent to each other, the third metallic layer of the second ESD unit and the fifth metallic layer of the central ESD structure respectively comprise a seventh tip portion and an eighth tip portion which are alternately arranged, the seventh tip portion and the eighth tip portion are insulated from each other to form a sixth ESD unit.

16. The ESD protection circuit according to claim 14, wherein, in the first ESD unit and the central ESD structure that are adjacent to each other, the second metallic layer of the first ESD unit and the sixth metallic layer of the central ESD structure respectively comprise a ninth tip portion and a tenth tip portion which are alternately arranged, the ninth tip portion and the tenth tip portion are insulated from each other to form a seventh ESD unit.

17. The ESD protection circuit according to claim 14, wherein, in the second ESD unit and the central ESD structure that are adjacent to each other, the fourth metallic layer of the second ESD unit and the sixth metallic layer of the central ESD structure respectively comprise an eleventh tip portion and a twelfth tip portion which are alternately arranged, the eleventh tip portion and the twelfth tip portion are insulated from each other to form an eighth ESD unit.

18. The ESD protection circuit according to claim 14, wherein the central ESD structure further comprises:

a central conductive structure electrically connected with the first active layer, the fifth metallic layer and the sixth metallic layer, respectively.

19. An array substrate, comprising:

the ESD protection circuit according to claim 1;

an organic light-emitting layer; and a think film transistor (TFT) unit, wherein the first active layer and an active layer of the TFT unit are located in a same layer; the first metallic layer and a first gate electrode of the TFT unit are located in a same layer; and the second metallic layer and a second gate electrode of the TFT unit are located in a same layer.

20. A display device, comprising the array substrate according to claim 19.

\* \* \* \* \*